US010958066B2

United States Patent
Shaqqo et al.

(10) Patent No.: US 10,958,066 B2
(45) Date of Patent: Mar. 23, 2021

(54) CONTROL METHOD FOR PROTECTING PRIMARY WINDINGS OF WIND TURBINE TRANSFORMERS

(71) Applicant: General Electric Company, Schenectady, NY (US)

(72) Inventors: Bacil Shaqqo, Roanoke, VA (US); David Smith, Daleville, VA (US)

(73) Assignee: General Electric Company, Schenectady, NY (US)

( * ) Notice: Subject to any disclaimer, the term of this patent is extended or adjusted under 35 U.S.C. 154(b) by 710 days.

(21) Appl. No.: 15/703,044

(22) Filed: Sep. 13, 2017

(65) Prior Publication Data

US 2019/0081473 A1    Mar. 14, 2019

(51) Int. Cl.
*H02H 9/02* (2006.01)
*H02H 9/04* (2006.01)
(Continued)

(52) U.S. Cl.
CPC ............... *H02H 9/02* (2013.01); *F03D 7/028* (2013.01); *F03D 7/0276* (2013.01);
(Continued)

(58) Field of Classification Search
CPC ........ F03D 17/00; F03D 7/0276; F03D 7/028; F03D 7/0288; F03D 80/82; F03D 9/255; G01R 31/62; G01R 31/72; H01F 27/402; H02H 9/02; H02H 9/045; H02P 2101/15; H02P 23/08; H02P 25/098; H02P 8/14; H02P 8/18; H02P 9/006; H02P 9/04; H02P 9/06; H02P 9/08; H02P 9/10; H02P 9/107; H02P 9/12
See application file for complete search history.

(56) References Cited

U.S. PATENT DOCUMENTS 7,895,847 B2    3/2011  Larsen
9,581,138 B2 *  2/2017  Wakasa ................. F03D 7/0284
(Continued)

FOREIGN PATENT DOCUMENTS

DE    20 2015 101 806 U1   4/2015
EP       1643609 A2 *      4/2006  .............. H02J 3/386
(Continued)

OTHER PUBLICATIONS

European Search Report, dated Feb. 12, 2019.
(Continued)

*Primary Examiner* — Jared Fureman
*Assistant Examiner* — Nicolas Bellido
(74) *Attorney, Agent, or Firm* — Dority & Manning, P.A.

(57) ABSTRACT

A method for protecting a three-winding transformer of a wind turbine includes estimating, via a controller, an electrical condition of the primary winding of the transformer. The method also includes determining, via the controller, an electrical condition limit of the primary winding. The method also includes comparing, via the controller, the estimated electrical condition to the electrical condition limit. Further, the method includes implementing a corrective action for the wind turbine if the estimated electrical condition exceeds the electrical condition limit so as to reduce the electrical condition within safe limits.

18 Claims, 4 Drawing Sheets

(51) Int. Cl.
  F03D 17/00    (2016.01)
  F03D 7/02     (2006.01)
  F03D 80/80    (2016.01)
  G01R 31/02    (2006.01)
  G01R 31/06    (2006.01)
  H02P 9/00     (2006.01)
  H01F 27/40    (2006.01)
  F03D 9/25     (2016.01)
  G01R 31/62    (2020.01)
  G01R 31/72    (2020.01)

(52) U.S. Cl.
  CPC .......... F03D 7/0288 (2013.01); F03D 9/255 (2017.02); F03D 17/00 (2016.05); F03D 80/82 (2016.05); G01R 31/62 (2020.01); G01R 31/72 (2020.01); H01F 27/402 (2013.01); H02H 9/045 (2013.01); H02P 9/006 (2013.01)

(56) References Cited

U.S. PATENT DOCUMENTS

| | | | |
|---|---|---|---|
| 2010/0133831 A1* | 6/2010 | Scholte-Wassink | F03D 7/0292 290/44 |
| 2011/0031762 A1 | 2/2011 | Heinz-Hermann | |
| 2012/0265356 A1* | 10/2012 | Yasugi | F03D 7/0276 700/287 |
| 2013/0181451 A1 | 7/2013 | Matzen et al. | |
| 2013/0187382 A1* | 7/2013 | Haag | F03D 9/255 290/44 |
| 2013/0214536 A1* | 8/2013 | Wakasa | F03D 7/0284 290/44 |
| 2013/0343089 A1 | 12/2013 | Gupta et al. | |
| 2015/0070939 A1 | 3/2015 | Gupta et al. | |
| 2015/0249414 A1* | 9/2015 | Barker | F03D 9/255 290/44 |
| 2015/0349688 A1* | 12/2015 | Wagoner | H02P 23/26 290/44 |
| 2016/0065105 A1* | 3/2016 | Hardwicke, Jr. | F03D 7/04 290/44 |

FOREIGN PATENT DOCUMENTS

EP         2290799 A1      2/2011
WO    WO 2012149984 A1    11/2012

OTHER PUBLICATIONS

U.S. Appl. No. 15/399,049, filed Jan. 5, 2017.
Islam et al., "Power Converters for Small- to Large-Scale Photovoltaic Power Plants", Power Converters for Medium Voltage Networks, Chapter 2, Springer-Verlag Berlin Heidelberg 2014, pp. 17-49.

* cited by examiner

CONTROL METHOD FOR PROTECTING PRIMARY WINDINGS OF WIND TURBINE TRANSFORMERS

FIELD

The present disclosure relates generally to wind turbines, and more particular to control methods for protecting primary windings of wind turbine transformers.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

During operation, wind impacts the rotor blades of the wind turbine and the blades transform wind energy into a mechanical rotational torque that rotatably drives a low-speed shaft. The low-speed shaft is configured to drive the gearbox that subsequently steps up the low rotational speed of the low-speed shaft to drive a high-speed shaft at an increased rotational speed. The high-speed shaft is generally rotatably coupled to a generator so as to rotatably drive a generator rotor. As such, a rotating magnetic field may be induced by the generator rotor and a voltage may be induced within a generator stator that is magnetically coupled to the generator rotor. In certain configurations, the associated electrical power can be transmitted to a transformer that is typically connected to a power grid via a grid breaker. Thus, the transformer steps up the voltage amplitude of the electrical power such that the transformed electrical power may be further transmitted to the power grid.

In many wind turbines, the generator rotor may be electrically coupled to a bi-directional power converter that includes a rotor-side converter joined to a line-side converter via a regulated DC link. More specifically, some wind turbines, such as wind-driven doubly-fed induction generator (DFIG) systems or full power conversion systems, may include a power converter with an AC-DC-AC topology.

The transformer generally has a primary winding connected to the power grid, a secondary winding connected to the generator stator, and a tertiary winding connected to the power converter. For conventional wind turbines, the rating of the primary winding is greater than the sum of the other two windings. Under these circumstances, there is no need to monitor the current of the primary winding as circumstances in which the primary winding current would be too high are prevented by the other two windings signaling the system to reduce current. For example, if the converter winding exceeds rated current, then the speed command is reduced, and if the stator winding current exceeds rated current, then the torque command is reduced. Though such systems are effective at protecting the primary winding, some modern wind turbines allow for a situation to arise where neither the stator winding nor the converter winding is exceeding rated current, but the primary winding is exceeding rated current. For example, some modern wind turbines have three-winding transformers where the primary winding has a lower current rating that the combination of the other two windings.

As such, a system and method capable of monitoring the current of the primary winding (i.e. the grid side current) of the transformer so as to implement protective control actions when needed would be advantageous. Accordingly, the present disclosure is directed to control methods for protecting primary windings of wind turbine transformers.

BRIEF DESCRIPTION

Aspects and advantages of embodiments of the present disclosure will be set forth in part in the following description, or may be learned from the description, or may be learned through practice of the embodiments.

In one aspect, the present disclosure is directed to a method for protecting a three-winding transformer of a wind turbine. The three-winding transformer has a primary winding, a secondary winding, and a tertiary winding. Thus, the method includes estimating, via a controller, an electrical condition of the primary winding of the transformer. The method also includes determining, via the controller, an electrical condition limit of the primary winding. The method also includes comparing, via the controller, the estimated electrical condition to the electrical condition limit. Further, the method includes implementing a corrective action for the wind turbine if the estimated electrical condition exceeds the electrical condition limit so as to reduce the electrical condition within safe limits.

In one embodiment, the method includes estimating the electrical condition of the primary winding of the transformer as a function of at least one of transformer losses, winding ratios, or current going into the secondary winding and/or the tertiary winding.

In another embodiment, the method may include determining the electrical condition limit of the primary winding using a piecewise linear function, a polynomial function, or any other suitable function. In such embodiments, the method may further include determining the electrical condition limit of the primary winding as a function of ambient temperature or altitude of the transformer.

In certain embodiments, the electrical condition may correspond to voltage and/or current of the primary winding of the transformer.

In additional embodiments, the step of implementing the corrective action may include generating an operating limit for the wind turbine and operating the wind turbine below the operating limit. More specifically, the operating limit may correspond to a torque limit, a speed limit, a current limit, or power limit. Thus, in particular embodiments, the step of implementing the corrective action may include incrementally reducing a torque of the wind turbine below the torque limit via a control loop until the estimated electrical condition is below the electrical condition limit.

In further embodiments, the method may also include implementing a time over current (TOC) function that will override the correction action if the estimated electrical condition exceeds the electrical condition limit by a certain amount.

In another aspect, the present disclosure is directed to a system for protecting a three-winding transformer of a wind turbine. The system includes at least one controller configured to perform one or more operations, including but not limited to estimating an electrical condition of a primary winding of the transformer, determining an electrical condition limit of the primary winding, comparing the estimated electrical condition to the electrical condition limit, and implementing a corrective action for the wind turbine if the estimated electrical condition exceeds the electrical condition limit so as to reduce the electrical condition within safe limits.

In one embodiment, the system may also include one or more sensors communicatively coupled to the controller. In such embodiments, the sensor(s) are configured to monitor current and/or voltage of one or more windings of the transformer. It should be also understood that the system may further include any of the additional features as described herein.

In yet another aspect, the present disclosure is directed to a method for protecting a transformer. The method includes estimating, via a controller, a current of a primary winding of the transformer as a function of at least one of transformer losses, winding ratios, or monitored current of one or more secondary windings. Further, the method includes determining, via the controller, a current limit of the primary winding as a function of at least one of ambient temperature or altitude of the transformer. The method also includes comparing, via the controller, the estimated current to the current limit. Further, the method includes reducing a torque of a generator of the wind turbine if the estimated current exceeds the current limit so as to reduce an actual current of the primary winding within safe limits. It should be also understood that the method may further include any of the additional steps and/or features as described herein.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the term "about" when used in reference to a multiplier means within 10% of the stated value. As used in the specification and the appended claims, the singular forms "a," "an," and "the" include plural referents unless the context clearly dictates otherwise.

Example aspects of the present disclosure are directed to systems and methods for controlling one or more transformers of a power system. In example embodiments, the transformer(s) can be controlled by estimating current of the primary winding thereof, comparing the estimated current to a current limit, and implementing a control action (e.g. limiting torque) to reduce the current. More specifically, the current of the primary may be estimated using knowledge of the transformer losses and the winding ratios in conjunction with the measured current going into the secondary windings. A current limit can also be created using a function of ambient temperature and altitude. The current limit is then compared with the estimated current. If the estimation exceeds the limit, then a torque limit is created to lower the amount of torque as the torque is directly proportional to the stator current. In addition, a time over current (TOC) function is configured to trip the wind turbine faster based on the disparity between the current limit and the estimated current.

In this way, the systems and methods according to example aspects of the present disclosure can have a number of technical effects and benefits. For instance, to create a primary winding with a rating higher than the secondary windings, the size and cost of the transformer would have to be increased. Therefore, the system and method of the present disclosure allows for a lower cost transformer to safely operate within system limits.

Figure 1:
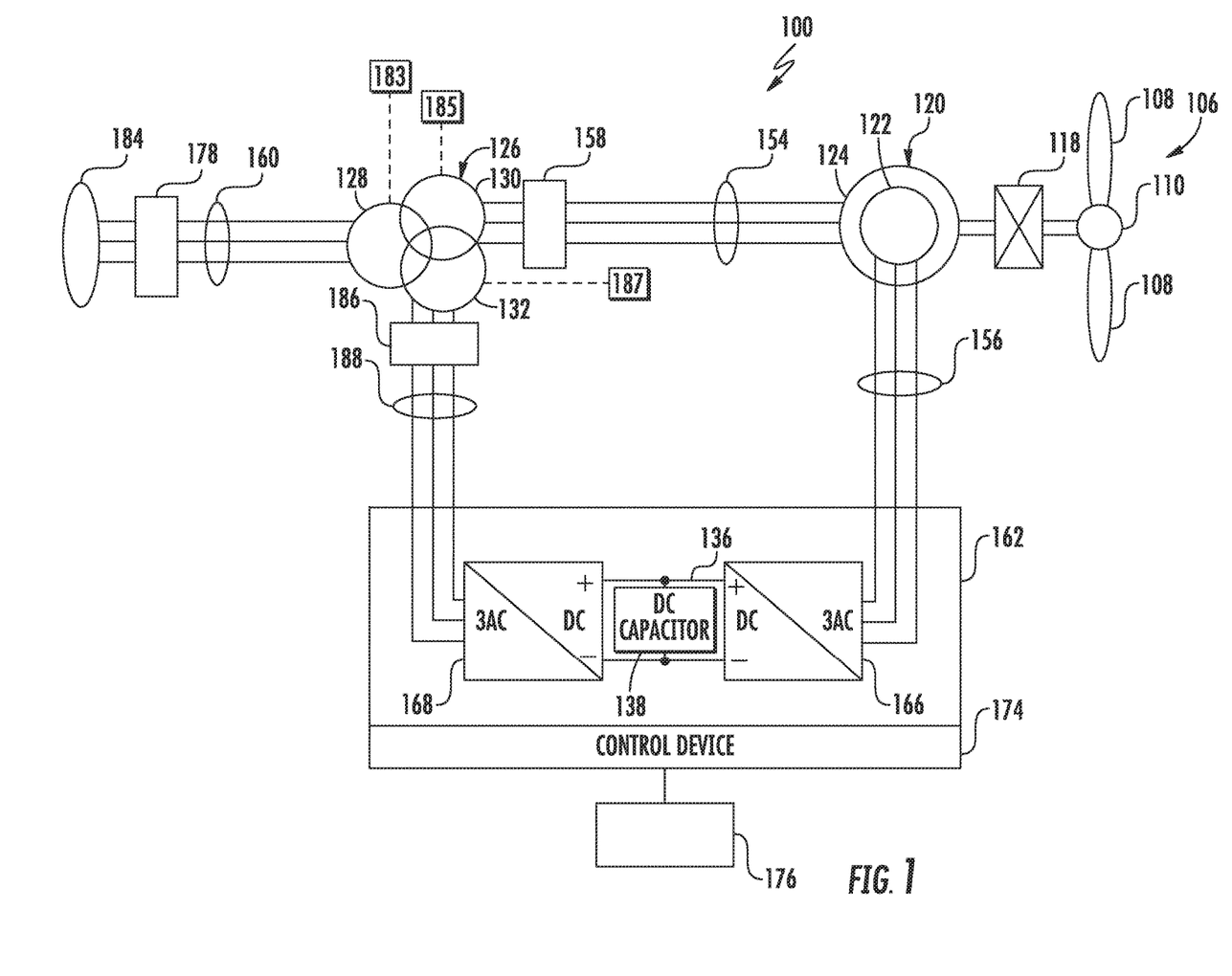
FIG. 1 illustrates a schematic diagram of one embodiment of a DFIG power system according to the present disclosure.

Referring now to the figures, example aspects of the present disclosure will be discussed in greater detail. More specifically, as shown, FIG. 1 illustrates a doubly fed induction generator (DFIG) wind turbine power system 100 according to example aspects of the present disclosure, which includes a DFIG 120. The present disclosure will be discussed with reference to the example wind turbine power system 100 of FIG. 1 for purposes of illustration and discussion. Those of ordinary skill in the art, using the disclosures provided herein, should understand that aspects of the present disclosure are also applicable in other systems, such as full power conversion wind turbine systems, solar power systems, energy storage systems, and other power systems.

In the example wind turbine power system 100, a rotational component 106 includes a plurality of rotor blades 108 coupled to a rotating hub 110. The rotational component 106 is coupled to an optional gear box 118, which is, in turn, coupled to a generator 120.

Further, as shown, the DFIG 120 includes a rotor 122 and a stator 124. Moreover, as shown, the DFIG 120 is typically coupled to a stator bus 154 and a power converter 162 via a rotor bus 156. The stator bus 154 provides an output multiphase power (e.g. three-phase power) from the stator 124 of the DFIG 120 and the rotor bus 156 provides a multiphase power (e.g. three-phase power) of the rotor 122 of the DFIG 120. Referring to the power converter 162, the DFIG 120 is coupled via the rotor bus 156 to a rotor side converter 166. Further, as shown, the rotor side converter 166 is coupled to a line side converter 168 which in turn is coupled to a line side bus 188. In various embodiments, a transformer 126 can be coupled to line side bus 188 to convert the AC power from the line side bus 188 to a voltage suitable for application to a cluster network or an electrical grid 184. For example, as shown, the transformer 126 is a three-winding transformer having, at least, a primary winding 128, a second winding 130, and a tertiary winding 132. More specifically, as shown, the main transformer 126 includes (1) a 10 to 34 kilovolt (kV) primary winding 128 connected to the power grid 184, (2) a 6 to 13.8 kV secondary winding 130 connected to the generator stator 124, and (3) a 690 to 900 volt (V) tertiary winding 132 connected to the line side converter 168 of the power converter 162.

In example configurations, the rotor side converter 166 and the line side converter 168 are configured for operating using pulse width modulation (PWM) arrangement of IGBT switching devices or other switching devices. Further, as shown, the rotor side converter 166 and the line side converter 168 can be electrically coupled via a DC bus 136 across which is the DC link capacitor 138.

Still referring to FIG. 1, the power converter 162 can be coupled to a control device 174 to control the operation of the rotor side converter 166 and the line side converter 168. It should be noted that the control device 174, in typical embodiments, is configured as an interface between the power converter 162 and a controller 176 of the wind turbine power system 100.

In some configurations, various circuit breakers including, for example, stator bus breaker 158, grid breaker 178, and/or line bus breaker 186 can be included for isolating various components as necessary for normal operation of the DFIG 120 during connection to and disconnection from the cluster network and/or the electrical grid 184. More specifically, as shown, the line bus breaker 186 can couple the line side bus 188 to the transformer 126, which is coupled to the cluster network or the electrical grid 184 via the cluster breaker or grid breaker 178 via bus 160.

In operation, power generated by the DFIG 120 by rotating the rotational component 106 is provided via a dual path to the cluster network or the electrical grid 184. The dual paths are defined by the stator bus 154 and the rotor bus 156. On the rotor bus side 156, sinusoidal multi-phase (e.g. three-phase) AC power is provided to the power converter 162. The rotor side power converter 166 converts the AC power provided from the rotor bus 156 into direct current ("DC") power and provides the DC power to the DC bus 136. Switching devices (e.g. IGBTs) used in parallel bridge circuits of the rotor side power converter 166 can be modulated to convert the AC power provided from the rotor bus 156 into DC power suitable for the DC bus 136.

The line side converter 168 converts the DC power on the DC bus 136 into AC power, which is provided to the line side bus 188. In particular, switching devices (e.g. IGBTs, MOSFETs, etc.) used in bridge circuits of the line side power converter 168 can be modulated to convert the DC power on the DC bus 136 into AC power on the line side bus 188. The transformer can convert the AC power at a first voltage from the line side bus 188 to AC power at a second voltage, such as the voltage of power on the stator bus 154. The AC power from the power converter 162 can be combined with the power from the stator of the DFIG 120 to provide multi-phase power (e.g. three-phase power) having a frequency maintained substantially at the frequency of the cluster network or the electrical grid 184 (e.g. 50 Hz/60 Hz).

The power converter 162 can receive control signals from, for instance, the controller 176 via the control device 174. The control signals can be based, among other things, on sensed conditions or operating characteristics of the wind turbine power system 100. Typically, the control signals provide for control of the operation of the power converter 162. For example, feedback in the form of sensed speed of the DFIG 120 can be used to control the conversion of the output power from the rotor bus 156 to maintain a proper and balanced multi-phase (e.g. three-phase) power supply. Other feedback from other sensors can also be used by the controller 176 to control the wind turbine power system 100, including, for example, transformer electrical condition sensors 183, 185, 187 as well as stator and rotor bus voltages and current feedbacks. Using the various forms of feedback information, switching control signals (e.g. gate timing commands for IGBTs), stator synchronizing control signals, and circuit breaker signals can be generated.

Figure 2:
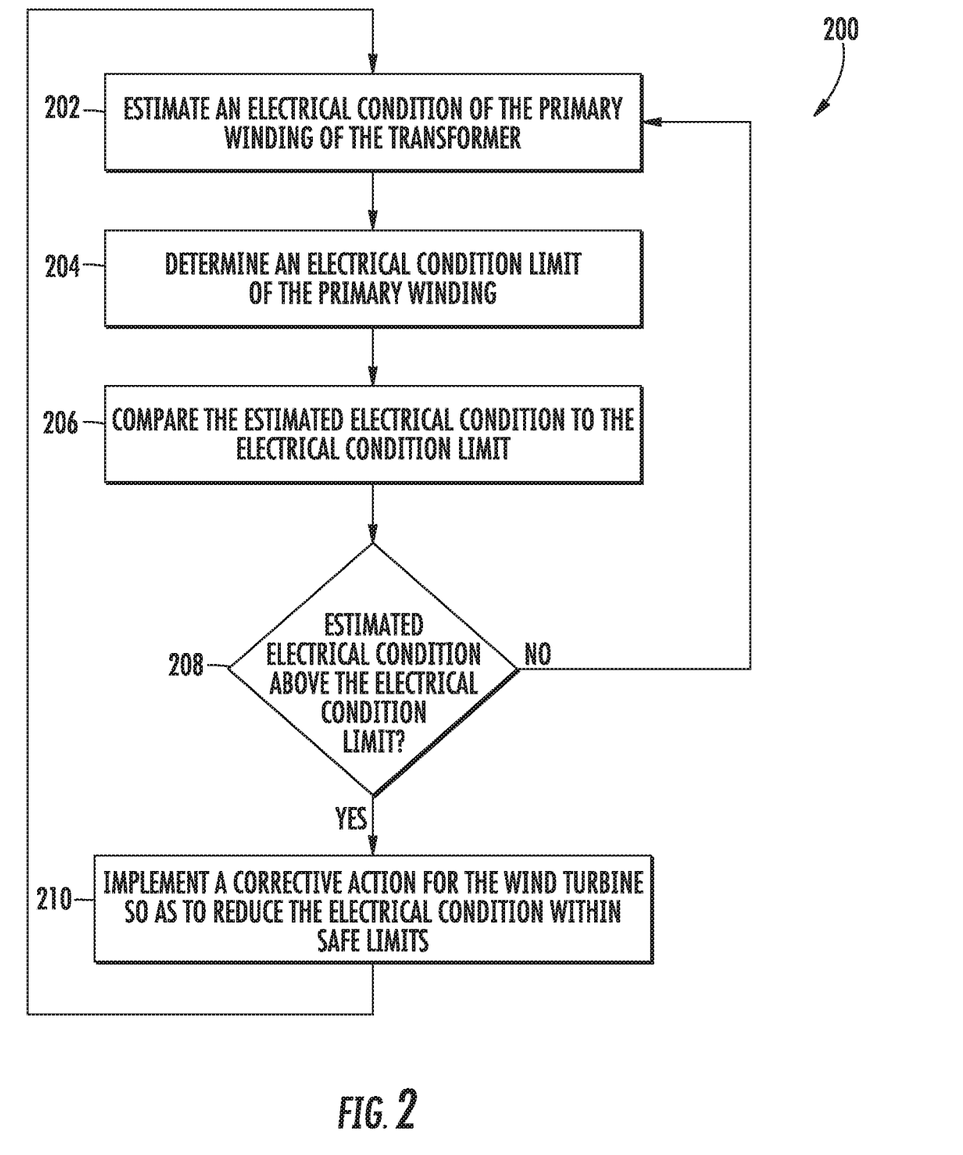
FIG. 2 illustrates a flow diagram of one embodiment of a method for protecting a primary winding of a transformer according to the present disclosure.

Referring now to FIG. 2, an example control method 200 for protecting a transformer according to example aspects of the present disclosure is illustrated. As shown at 202, the method 200 includes estimating an electrical condition of the primary winding 128 of the transformer 126. For example, in certain embodiments, the electrical condition may correspond to voltage and/or current of the primary winding 128 of the transformer 126. Thus, in one embodiment, the controller 176 is configured to estimate the current of the primary winding 128 of the transformer 126 as a function of at least one of transformer losses, winding ratios, or current going into the secondary winding and/or the tertiary winding.

Figure 4:
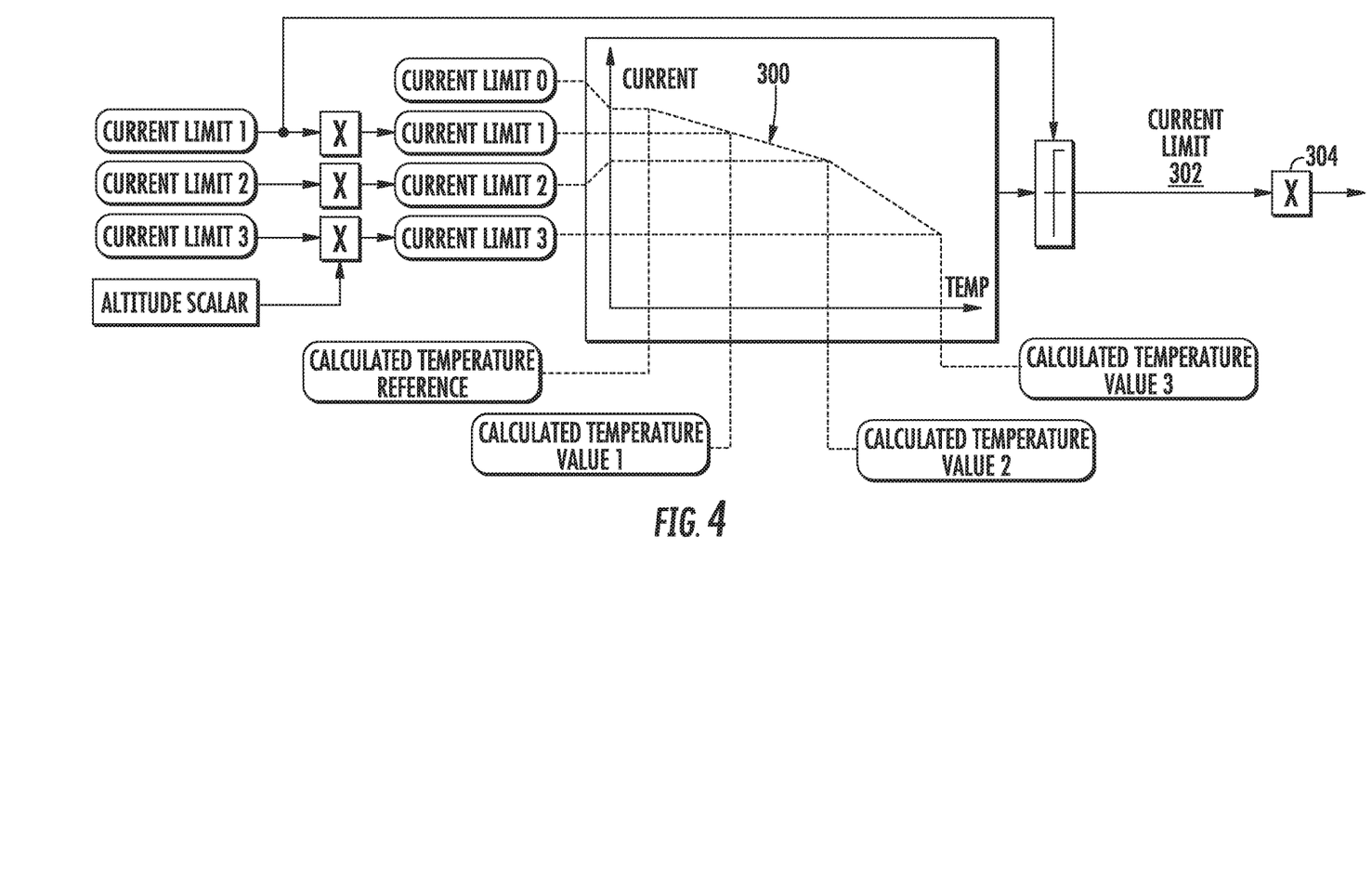
FIG. 4 illustrates a schematic diagram of one embodiment of a control scheme for protecting a primary winding of a transformer according to the present disclosure.

As shown at 204, the method 200 includes determining an electrical condition limit, e.g. such as a current limit, of the primary winding 128. For example, in one embodiment, the controller 176 may determine the current limit of the primary winding 128 using a piecewise linear function, a polynomial function, or similar. As used herein, a piecewise linear function generally refers to a real-valued function defined on the real numbers or a segment thereof, whose graph is composed of straight-line sections, as shown in FIG. 4. A polynomial function, as used herein, generally refers to a function, such as quadratic, cubic, quartic, and so on. More specifically, as shown, one example of the function is illustrated by line 300, in which a piecewise linear function 300 is used. Further, as shown, the controller 176 is configured to generate the function 300 as a function of ambient temperature (y-axis) and/or altitude of the transformer 126. As such, the controller 176 determines a plurality of current limits 1, 2, and 3, and multiplies the current limits 1, 2, and 3, by an altitude scalar value. As such, the multiplied values are inputs for the function 300. The controller 176 also calculates a temperature reference value and a plurality of calculated temperature values 1, 2, and 3. As such, the controller 176 generates the function 300 based on the current limits 1, 2, 3 and the temperature values 1, 2, 3. From the function 300, the controller 176 can then determine the current limit 302. In certain embodiments, as shown, the controller 176 may also multiply the current limit 302 by a scalar factor 304.

Referring back to FIG. 2, as shown at 206, the method 200 includes comparing the estimated electrical condition to the electrical condition limit. Further, as shown at 208, the controller 176 is configured to determine whether the estimated electrical condition is above the electrical condition limit. If so, as shown at 210, the method 200 includes implementing a corrective action for the wind turbine power system 100 if the estimated electrical condition exceeds the electrical condition limit so as to reduce the electrical condition within safe limits. More specifically, in one embodiment, the controller 176 may generate an operating limit for the wind turbine power system 100 and operating the wind turbine power system 100 below the operating limit. In such embodiments, the operating limit may correspond to a torque limit, a speed limit, a current limit, or power limit. Thus, in particular embodiments, the controller 176 may incrementally reducing a torque of the wind turbine power system 100 below the torque limit via a control loop until the estimated electrical condition is below the electrical condition limit. If the estimated electrical condition is below the electrical condition limit, the wind turbine power system 100 maintains normal operation.

In further embodiments, the method 200 may also include implementing a time over current (TOC) function that will override the correction action if the estimated electrical condition exceeds the electrical condition limit by a certain amount.

Figure 3:
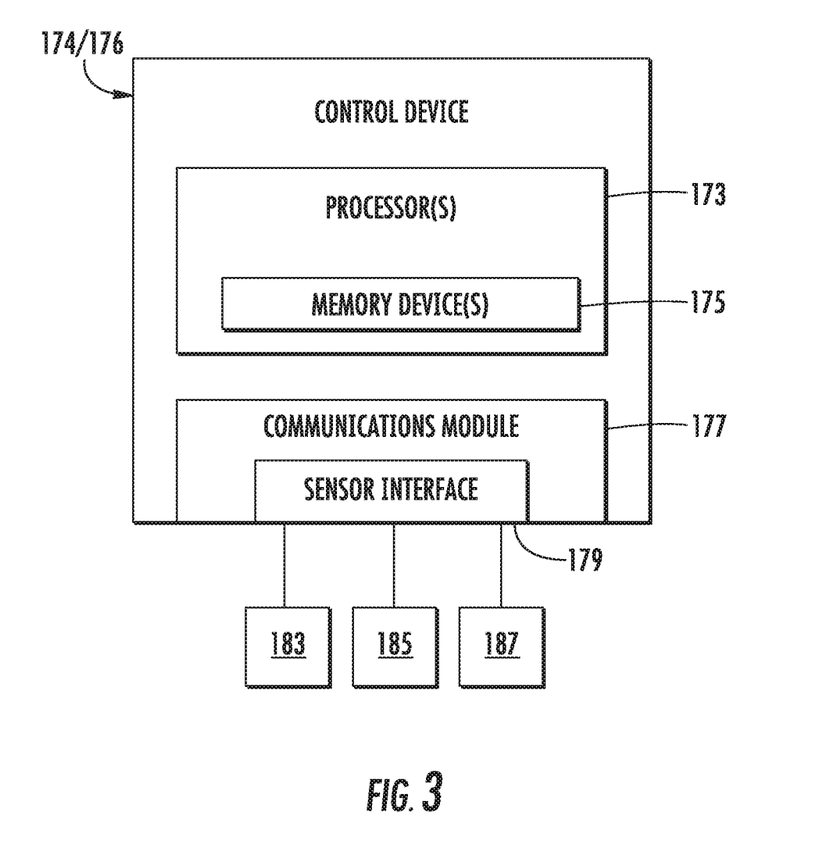
FIG. 3 illustrates a block diagram of suitable components that may be included in a control device according to the present disclosure.

Referring now to FIG. 3, an example controller 176 (or control device 174) according to example embodiments of the present disclosure is illustrated. As shown, the controller 176 can be, for example, a control device associated with an DFIG wind turbine system, a wind farm (e.g., a cluster-level or farm-level control device) and/or can include one or more control devices associated with aspects of a wind turbine system, such as one or more control devices associated with a power conversion system 162. In some embodiments, the controller 176 can include one or more processor(s) 173 and one or more memory device(s) 175. The processor(s) 173 and memory device(s) 175 can be distributed so that they are located at one more locales or with different devices.

The processor(s) 173 and memory device(s) 175 can be configured to perform a variety of computer-implemented functions and/or instructions (e.g., performing the methods, steps, calculations and the like and storing relevant data as disclosed herein). The instructions when executed by the processor(s) 173 can cause the processor(s) 173 to perform operations according to example aspects of the present disclosure. For instance, the instructions when executed by the processor(s) 173 can cause the processor(s) 173 to implement the methods of FIG. 2 discussed herein.

Additionally, the controller 176 can include a communication module 177 to facilitate communications between the controller 176 and various components of a wind turbine system, wind farm, or power system, including power demand parameters or power generation set points as described herein. Further, the communication module 177 can include a sensor interface 179 (e.g., one or more analog-to-digital converters) to permit signals transmitted from one or more sensors 183, 185, 187 to be converted into signals that can be understood and processed by the processor(s) 173. It should be appreciated that the sensors (e.g. sensors 183, 185, 187) can be communicatively coupled to the sensor interface 179 using any suitable means, such as a wired or wireless connection. The signals can be communicated using any suitable communications protocol. The sensors 183, 185, 187 can be, for example, voltage sensors, current sensors, power sensors, temperature sensors, or any other sensor device described herein. As such, the processor(s) 173 can be configured to receive one or more signals from the sensor(s) 183, 185, 187.

As used herein, the term "processor" refers not only to integrated circuits referred to in the art as being included in a computer, but also refers to a control device, a microcontrol device, a microcomputer, a programmable logic control device (PLC), an application specific integrated circuit, and other programmable circuits. Additionally, the memory device(s) 175 can generally include memory element(s) including, but not limited to, computer readable medium (e.g., random access memory (RAM)), computer readable non-volatile medium (e.g., a flash memory), a compact disc-read only memory (CD-ROM), a magneto-optical disk (MOD), a digital versatile disc (DVD) and/or other suitable memory elements. Such memory device(s) 175 can generally be configured to store suitable computer-readable instructions that, when implemented by the processor(s) 173, configure the control device 174 to perform the various functions as described herein.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for protecting a three-winding transformer of a wind turbine, the three-winding transformer having a primary winding, a secondary winding, and a tertiary winding, the method comprising:
   estimating, via a controller, an electrical condition of the primary winding of the transformer;
   determining, via the controller, an electrical condition limit of the primary winding as a function of at least one of ambient temperature or altitude of the transformer;
   comparing, via the controller, the estimated electrical condition to the electrical condition limit; and,
   implementing a corrective action for the wind turbine when the estimated electrical condition exceeds the electrical condition limit so as to reduce the electrical condition within safe limits.

2. The method of claim 1, further comprising estimating the electrical condition of the primary winding of the transformer as a function of at least one of transformer losses, winding ratios, or current going into the secondary winding and/or the tertiary winding.

3. The method of claim 1, further comprising determining the electrical condition limit of the primary winding using at least one of a piecewise linear function or a polynomial function.

4. The method of claim 1, wherein the electrical condition comprises voltage or current.

5. The method of claim 1, wherein implementing the corrective action further comprises generating an operating limit for the wind turbine and operating the wind turbine below the operating limit.

6. The method of claim 5, wherein the operating limit comprises at least one of a torque limit, a speed limit, a current limit, or power limit.

7. The method of claim 6, wherein implementing the corrective action further comprises incrementally reducing a torque of the wind turbine below the torque limit via a control loop until the estimated electrical condition is below the electrical condition limit.

8. The method of claim 1, further comprising implementing a time over current (TOC) function that will override the correction action when the estimated electrical condition exceeds the electrical condition limit by a predetermined amount.

9. A system for protecting a three-winding transformer of a wind turbine, the three-winding transformer having a primary winding, a secondary winding, and a tertiary winding, the system comprising:
    at least one controller configured to perform one or more operations, the one or more operations comprising:
    estimating an electrical condition of the primary winding of the transformer;
    determining an electrical condition limit of the primary winding as a function of at least one of ambient temperature or altitude of the transformer;
    comparing the estimated electrical condition to the electrical condition limit; and,
    implementing a corrective action for the wind turbine when the estimated electrical condition exceeds the electrical condition limit so as to reduce the electrical condition within safe limits.

10. The system of claim 9, further comprising one or more sensors communicatively coupled to the at least one controller, the one or more sensors configured to monitor current and/or voltage of one or more windings of the transformer.

11. The system of claim 10, wherein the one or more operations further comprise estimating the electrical condition of the primary winding of the transformer as a function of at least one of transformer losses, winding ratios, or the monitored current of the one or more windings.

12. The system of claim 9, wherein the one or more operations further comprise determining the electrical condition limit of the primary winding using a piecewise linear function.

13. The system of claim 9, wherein the electrical condition comprises voltage or current.

14. The system of claim 9, wherein implementing the corrective action further comprises generating an operating limit for the wind turbine and operating the wind turbine below the operating limit.

15. The system of claim 14, wherein the operating limit comprises at least one of a torque limit, a speed limit, a current limit, or power limit.

16. The system of claim 15, wherein implementing the corrective action further comprises incrementally reducing a torque of the wind turbine below the torque limit via a control loop until the estimated electrical condition is below the electrical condition limit.

17. The system of claim 9, wherein the one or more operations further comprise implementing a time over current (TOC) function that will override the correction action when the estimated electrical condition exceeds the electrical condition limit by a predetermined amount.

18. A method for protecting a transformer, the method comprising:
    estimating, via a controller, a current of a primary winding of the transformer as a function of at least one of transformer losses, winding ratios, or monitored current of one or more secondary windings;
    determining, via the controller, a current limit of the primary winding as a function of at least one of ambient temperature or altitude of the transformer;
    comparing, via the controller, the estimated current to the current limit; and,
    reducing a torque of a generator of the wind turbine when the estimated current exceeds the current limit so as to reduce an actual current of the primary winding within safe limits.

* * * * *